US012591019B2

(12) United States Patent
Feng et al.

(10) Patent No.: US 12,591,019 B2
(45) Date of Patent: Mar. 31, 2026

(54) METHOD FOR GENERATING ELECTROCHEMICAL IMPEDANCE SPECTROSCOPY OF BATTERY, MEDIUM, AND COMPUTER DEVICE

(71) Applicant: BYD COMPANY LIMITED, Shenzhen (CN)

(72) Inventors: Tianyu Feng, Shenzhen (CN); Linwang Deng, Shenzhen (CN); Shiwei Shu, Shenzhen (CN); Xiaoqian Li, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 361 days.

(21) Appl. No.: 18/189,607

(22) Filed: Mar. 24, 2023

(65) Prior Publication Data

US 2023/0236257 A1     Jul. 27, 2023

Related U.S. Application Data

(63) Continuation of application No. PCT/CN2021/109651, filed on Jul. 30, 2021.

(51) Int. Cl.
G01R 31/389 (2019.01)
B60L 58/10 (2019.01)
(Continued)

(52) U.S. Cl.
CPC ........... G01R 31/389 (2019.01); G01R 23/16 (2013.01); G01R 25/00 (2013.01); H02J 7/0047 (2013.01); B60L 58/10 (2019.02); H01M 10/48 (2013.01)

(58) Field of Classification Search
CPC .......................... G01R 31/389; G01R 31/3842; G01R 31/367; G01R 31/385; G01R 31/392;
(Continued)

(56) References Cited

U.S. PATENT DOCUMENTS

| | | | |
|---|---|---|---|
| 6,556,001 B1 | 4/2003 | Wiegand et al. | |
| 2011/0208452 A1* | 8/2011 | Mingant | ............. G01R 31/389 |
| | | | 702/63 |

(Continued)

FOREIGN PATENT DOCUMENTS

| | | |
|---|---|---|
| CN | 1967270 A | 5/2007 |
| CN | 101194836 A | 6/2008 |

(Continued)

OTHER PUBLICATIONS

Translation of JP 2001129775 (Year: 2001).*

(Continued)

*Primary Examiner* — Manuel L Barbee
(74) *Attorney, Agent, or Firm* — Wenye Tan

(57) ABSTRACT

A method for generating an electrochemical impedance spectrum for a battery includes: collecting, in a discharge state of a battery, battery discharge information of the battery periodically according to a preset collection interval, where the battery discharge information includes collection time, and current information and voltage information associated with the collection time; performing Fourier transform according to the collection interval and battery discharge information, to obtain multiple frequency-based first battery signals; determining a second battery signal from the multiple first battery signals, where the second battery signal includes a voltage signal greater than or equal to a preset voltage threshold; and determining an electrochemical impedance at a corresponding frequency according to the second battery signal, and constructing an electrochemical impedance spectrum according to all the electrochemical impedance.

19 Claims, 3 Drawing Sheets

(51) Int. Cl.
  G01R 23/16       (2006.01)
  G01R 25/00       (2006.01)
  H01M 10/48       (2006.01)
  H02J 7/00        (2006.01)

(58) Field of Classification Search
  CPC ...... G01R 31/396; G01R 23/16; G01R 25/00;
                 H02J 7/0047; B60L 58/10
  See application file for complete search history.

(56) References Cited

U.S. PATENT DOCUMENTS

| | | | |
|---|---|---|---|
| 2017/0219660 A1 | 8/2017 | Christensen et al. | |
| 2018/0059191 A1 | 3/2018 | Abu Qahouq | |
| 2018/0217209 A1 | 8/2018 | Marsili et al. | |
| 2022/0163592 A1* | 5/2022 | Barsukov ........... | G01R 31/3842 |

FOREIGN PATENT DOCUMENTS

| | | | | |
|---|---|---|---|---|
| CN | 101348085 A | | 1/2009 | |
| CN | 101383582 A | | 3/2009 | |
| CN | 101477179 A | | 7/2009 | |
| CN | 101871974 A | | 10/2010 | |
| CN | 103323781 A | | 9/2013 | |
| CN | 104950180 A | | 9/2015 | |
| CN | 106970266 A | * | 7/2017 | .......... G01R 31/389 |
| CN | 105449241 B | | 10/2017 | |
| CN | 110161421 A | | 8/2019 | |
| CN | 106618568 B | | 5/2020 | |
| CN | 109459465 B | | 8/2020 | |
| JP | 2001129775 A | * | 5/2001 | |
| JP | 2013085379 A | | 5/2013 | |
| JP | 2013537638 A | | 10/2013 | |
| JP | 2014238301 A | | 12/2014 | |
| JP | 2019039700 A | | 3/2019 | |
| WO | 2020003841 A1 | | 1/2020 | |

OTHER PUBLICATIONS

The World Intellectual Property Organization (WIPO) International
Search Report for PCT/CN2021/109651 Nov. 4, 2021 8 Pages.

* cited by examiner

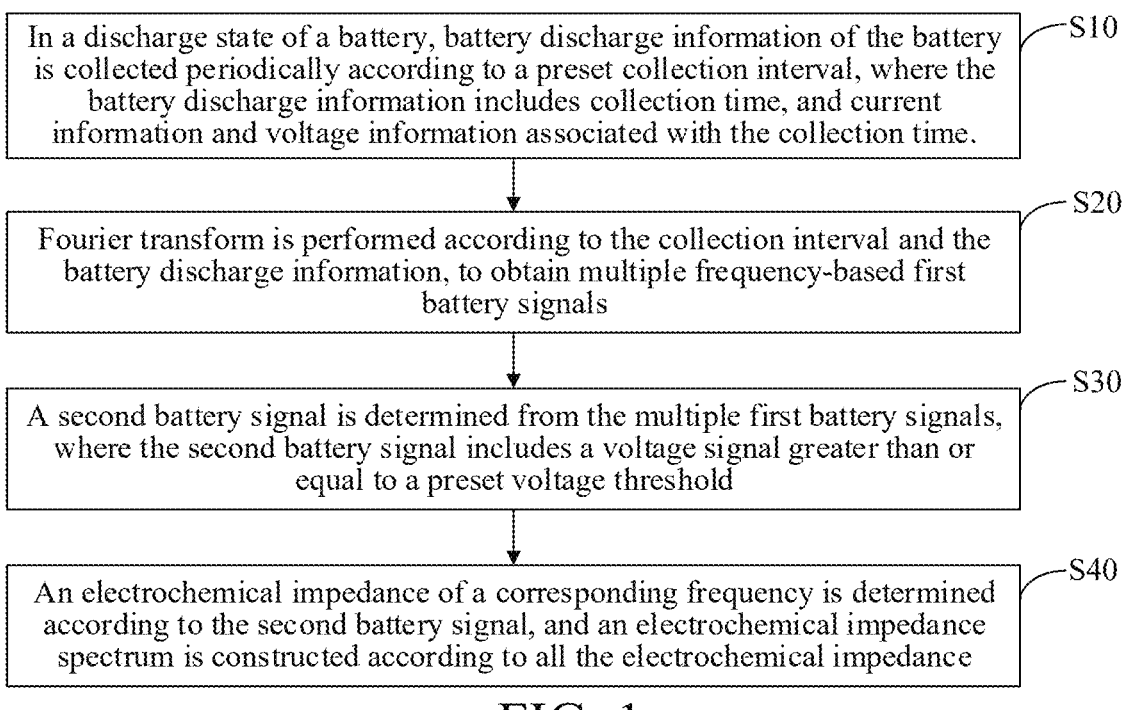

In a discharge state of a battery, battery discharge information of the battery is collected periodically according to a preset collection interval, where the battery discharge information includes collection time, and current information and voltage information associated with the collection time. ⟋S10

Fourier transform is performed according to the collection interval and the battery discharge information, to obtain multiple frequency-based first battery signals ⟋S20

A second battery signal is determined from the multiple first battery signals, where the second battery signal includes a voltage signal greater than or equal to a preset voltage threshold ⟋S30

An electrochemical impedance of a corresponding frequency is determined according to the second battery signal, and an electrochemical impedance spectrum is constructed according to all the electrochemical impedance ⟋S40

FIG. 1

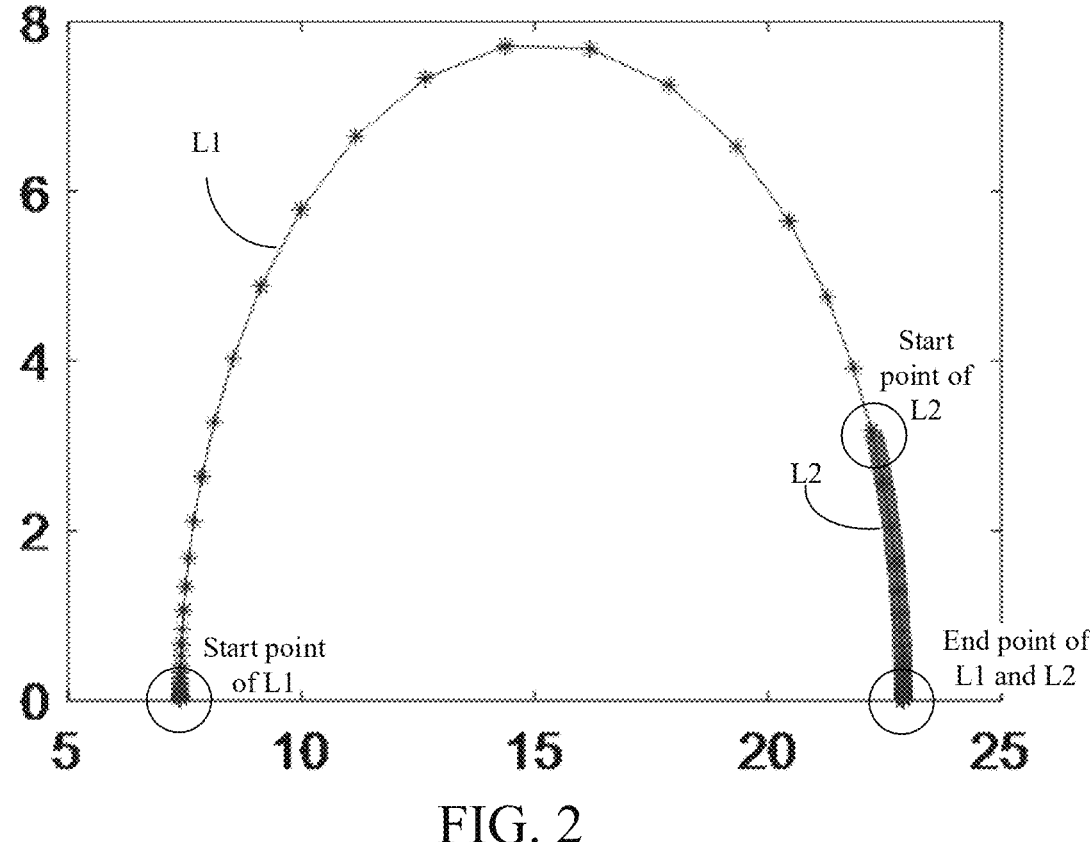

FIG. 2

METHOD FOR GENERATING ELECTROCHEMICAL IMPEDANCE SPECTROSCOPY OF BATTERY, MEDIUM, AND COMPUTER DEVICE

CROSS-REFERENCE TO RELATED APPLICATIONS

The present application is a continuation application of PCT application No. PCT/CN2021/109651 filed on Jul. 30, 2021, which claims priority to Chinese Patent Application No. 202011034840.1 filed on Sep. 27, 2020 and entitled "METHOD FOR GENERATING ELECTROCHEMICAL IMPEDANCE SPECTROSCOPY OF BATTERY, MEDIUM, AND COMPUTER DEVICE", content of all of which is incorporated herein by reference in its entirety.

FIELD

The present disclosure relates to the technical field of batteries, and particularly to a method for generating an electrochemical impedance spectrum for a battery, a medium, and a computer device.

BACKGROUND

In the related art, an electrochemical impedance spectrum for lithium battery analysis is generally measured by an electrochemical workstation. However, in the measurement of the electrochemical impedance spectrum by the electrochemical workstation, the time needed is long, and the volume of the electrochemical workstation is large, requiring a large space for installation.

SUMMARY

Embodiments of the present disclosure provide a method for generating an electrochemical impedance spectrum for a battery, a medium, and a computer device, to reduce the time needed in the measurement of the electrochemical impedance spectrum and reduce the space for installation related measurement apparatus.

In a first aspect, the present disclosure provides a method for generating an electrochemical impedance spectrum for a battery. The method includes: collecting, in a discharge state of the battery, battery discharge information of the battery periodically according to a preset collection interval, wherein the battery discharge information comprises collection time, and current information and voltage information associated with the collection time; performing Fourier transform according to the collection interval and the battery discharge information, to obtain multiple frequency-based first battery signals; determining a second battery signal from the multiple first battery signals, wherein the second battery signal comprises a voltage signal greater than or equal to a preset voltage threshold; and determining an electrochemical impedance of a corresponding frequency according to the second battery signal, and constructing an electrochemical impedance spectrum according to all the electrochemical impedance.

In a second aspect, the present disclosure provides a computer-readable storage medium, on which a computer program is stored. The computer program, when executed by a processor, implements the method for generating an electrochemical impedance spectrum for a battery according to the present disclosure.

In a third aspect, the present disclosure provides a computer device, which includes a memory, a processor, and a computer program stored on the memory and executed by the processor. The computer program, when executed by a processor, implements the method for generating an electrochemical impedance spectrum for a battery according to the present disclosure.

In the present disclosure, an electrochemical impedance spectrum is constructed by fast Fourier transform according to the voltage information and current information in a discharge state of a battery. In this way, the use of external devices is reduced, the approaches to obtaining the electrochemical influence spectrum are widened, the electrochemical impedance spectrum can be obtained more flexibly in different scenarios, and it is more universal and convenient during implementation. Moreover, the electrochemical impedance spectrum curve obtained in the present disclosure is consistent with the electrochemical impedance spectrum curve obtained in the related art. That is, the electrochemical impedance spectrum constructed in the present disclosure has high accuracy and high feasibility. Furthermore, the electrochemical impedance of different effective frequencies can be obtained in a short time in the present disclosure, thus improving the speed of constructing the electrochemical impedance spectrum.

BRIEF DESCRIPTION OF THE DRAWINGS

To describe the technical solutions in some embodiments of the present disclosure more clearly, the drawings used in the description of the embodiments of the present disclosure will be described briefly below. Apparently, the accompanying drawings in the following description show merely some embodiments of the present disclosure, and other drawings can be obtained by a person of ordinary skill in the art based on these drawings without creative efforts.

FIG. 1 is a flow chart of a method for generating an electrochemical impedance spectrum for a battery according to an embodiment of the present disclosure;

FIG. 2 is a schematic diagram of an electrochemical impedance spectrum in a method for generating an electrochemical impedance spectrum for a battery according to an embodiment of the present disclosure;

DETAILED DESCRIPTION

Figure 3:
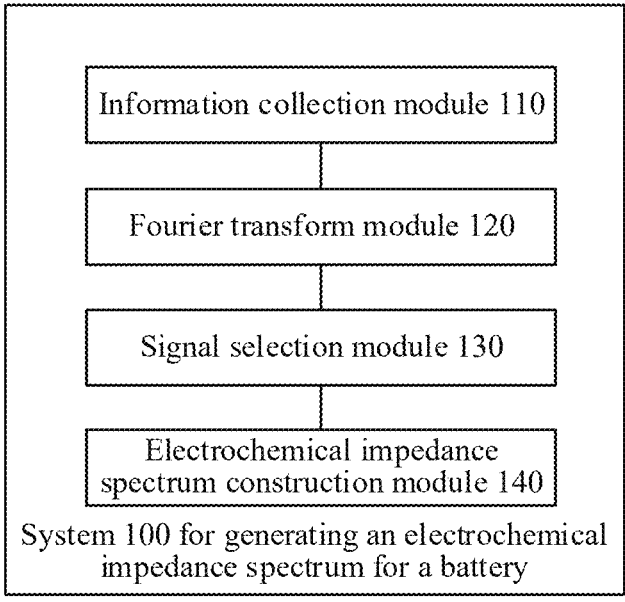
FIG. 3 is a structural block diagram of a system for generating an electrochemical impedance spectrum for a battery according to an embodiment of the present disclosure.

The technical solutions in embodiments of the present disclosure are described below with reference to the accompanying drawings. Obviously, the described embodiments are some rather than all of the embodiments of the present disclosure. All other embodiments obtained by a person of ordinary skill in the art without creative efforts based on the embodiments of the present invention shall fall within the protection scope of the present invention.

In an embodiment of the present disclosure, as shown in FIG. 1, a method for generating an electrochemical impedance spectrum for a battery is provided, which includes the following steps:

S10: In a discharge state of a battery, battery discharge information of the battery is collected periodically according to a preset collection interval, where the battery discharge information includes collection time, and current information and voltage information.

In an embodiment of the present disclosure, the battery can be a stand-alone battery or a power battery installed on a new energy vehicle. The discharge state refers to the state when the battery is discharged to power other devices. For example, during the traveling of a new energy vehicle, the battery is in a discharge state. The preset collection interval refers to the collection time interval between two adjacent sets of battery discharge information in the periodically collected battery discharge information of the battery. The collection time refers to the time point when the battery discharge information is collected. The current information refers to the corresponding current value of the battery at each collection time, and the voltage information refers to the corresponding voltage value of the battery at each collection time. It can be understood that the current information and voltage information collected at different collection time may be different, or the same (for example, when the collection time interval is small and the current information and voltage information have little change, no change will be shown in the current information and voltage information if the accuracy of the collected data is low).

S20: Fourier transform is performed according to the collection interval and the battery discharge information, to obtain multiple frequency-based first battery signals.

The Fourier transform refers to a process in which the battery discharge information is converted into a time-based battery signal, and then the time-based battery signal is converted into a frequency-based first battery signal.

Specifically, in the discharge state of the battery, after the battery discharge information of the battery is collected periodically according to the preset collection interval, Fourier transform is performed according to the collection interval and the battery discharge information. During the Fourier transform process, the battery discharge information is converted into a time-based battery signal (that is, a relation of the battery signal vs the collection time and collection interval); and then the time-based battery signal is converted into a frequency-based first battery signal, where the frequency-based first battery signal characterizes the relation between the battery discharge information and the frequency.

S30: A second battery signal is determined from the multiple first battery signals, where the second battery signal includes a voltage signal greater than or equal to a preset voltage threshold.

The frequency-based first battery signal includes a frequency-based voltage signal. When a voltage value corresponding to the frequency-based voltage signal is greater than a preset voltage threshold, the corresponding frequency-based first battery signal is a second battery signal, and the frequency corresponding to the second battery signal is recorded as an effective frequency.

In some embodiments, the preset voltage threshold is in the range of 0.1 to 0.5 V. That is, the preset voltage threshold can be set to any value in the range of 0.1 to 0.5 V, and the preset voltage threshold is an empirical value obtained through experiments. Compared with other battery signals, the curve corresponding to the electrochemical impedance spectrum constructed according to the electrochemical impedance corresponding to the various second battery signals in subsequent Step S30 is more smooth, and has no glitch noises.

In some embodiments, in an experimental stage of constructing an electrochemical impedance spectrum by the method for generating an electrochemical impedance spectrum for a battery according to the present disclosure in the discharge process, if a preset voltage threshold is not introduced, the electrochemical impedance spectrum curve constructed according to the electrochemical impedance corresponding to all the first battery signals has many glitch noises, This is because some first battery signals are interfered by noises, causing that the electrochemical impedance spectrum curve can't be smooth enough due to the influence from glitch noises. Therefore, in the present disclosure, the first battery signals are screened by introducing a preset voltage threshold, and the experimental results show that the glitch noises in the obtained electrochemical impedance spectrum curve will be accordingly reduced. Therefore, during the process of determining the preset voltage threshold, an initial voltage threshold (such as 0.01 V) is set for an initial experiment, and then the initial voltage threshold is increased by a voltage increment interval (for example, an increment of 0.05 V each time), until the obtained electrochemical impedance spectrum curve is a smooth curve. That is, when the electrochemical impedance spectrum curve has almost no glitch noises, a current voltage threshold is determined to be within the range of the preset voltage threshold. In the present disclosure, the finally obtained preset voltage threshold is in the range of 0.1 to 0.5 V.

Specifically, fast Fourier transform is performed according to the collection interval and the battery discharge information, to obtain frequency-based first battery signals corresponding to the battery discharge information, then voltage signals in all the frequency-based first battery signal are compared with the preset voltage threshold, next, a frequency-based first battery signal with a voltage signal that is greater than or equal to the preset voltage threshold is determined to be second battery signal, and the frequency corresponding to the second battery signal is recorded as an effective frequency.

In another specific example, fast Fourier transform is performed according to the collection interval and the battery discharge information, to obtain frequency-based first battery signals corresponding to the battery discharge information. If the voltage signal in the frequency-based first battery signal is less than the preset voltage threshold, it indicates that the frequency-based first battery signal may be in the same order of magnitude as a noise signal, and interfered by the noise. In this case, the effective impedance information of the battery cannot be obtained through the current and voltage signals, so the frequency-based first battery signal cannot be determined as the second battery signal. Therefore, the frequency-based first battery signal interfered by the noise can be removed. to improve the accuracy of the electrochemical impedance spectrum constructed in the following Step S40.

S40: An electrochemical impedance of a corresponding frequency is determined according to the second battery signal, and an electrochemical impedance spectrum is constructed according to all the electrochemical impedance.

The electrochemical impedance is determined according to the voltage signal and current signal in the second battery signal. The electrochemical impedance spectrum (EIS) shows the change of the ratio of the voltage signal to current signal vs the effective frequency. The Nyquist plot shown in FIG. 2 is an electrochemical impedance spectrum. In FIG. 2, the horizontal axis represents the real part of the electrochemical impedance, and the vertical axis represents the imaginary part of the electrochemical impedance; and L1 represents an electrochemical impedance spectrum curve measured and constructed by an electrochemical workstation in the related art; L2 is a curve corresponding to the electrochemical impedance spectrum constructed by the method described in the present disclosure (each point in L2 represents the effective frequency of the second battery signal corresponding to the electrochemical impedance), and the L2 curve partially overlaps the L1 curve (that is, the bold part corresponding to L2 in FIG. 2 is the overlapping part of L1 and L2). It can be understood that L2 is obtained from data sampled on board, and the corresponding highest frequency after Fourier transform is limited by the sample interval. For example, if the sample interval is Ts, the highest frequency that can be resolved is fmax=½ Ts. The lowest frequency is limited by the total sampling duration. For example, if the total sampling duration is Tt, the lowest frequency is fmin=1/Tt. Therefore, the start point of L2 is limited by the sampling frequency on board. Compared with the present disclosure, an off-line electrochemical workstation can measure a higher frequency. It can be seen from FIG. 2 that the electrochemical impedance spectrum constructed by the present disclosure is consistent with the electrochemical impedance spectrum constructed by an electrochemical workstation in related art. That is, the electrochemical impedance spectrum constructed in the present disclosure has high accuracy, and the electrochemical impedance information corresponding to multiple frequencies can be obtained in a short time in the present disclosure.

Specifically, after determining the second battery signal from all the frequency-based first battery signals, the effective frequency corresponding to the second battery signal is obtained, to determine the electrochemical impedance corresponding to the second battery signal according to the effective frequency and the corresponding second battery signal. Further, after determining the electrochemical impedance corresponding to all the second battery signals, the electrochemical impedance spectrum is constructed according to the real part and imaginary part of each electrochemical impedance and the corresponding effective frequency. The electrochemical impedance spectrum can be used in the aging detection and temperature detection of the battery, etc.

In an embodiment of the present disclosure, the electrochemical impedance spectrum can be constructed by fast Fourier transform according to the voltage information and current information in the discharge state of the battery. In this way, the use of external devices is reduced, and it is more universal and convenient during implementation. Moreover, the electrochemical impedance spectrum curve obtained in the present disclosure is consistent with the electrochemical impedance spectrum curve obtained in the related art. That is, the electrochemical impedance spectrum constructed in the present disclosure has high accuracy and high feasibility. Furthermore, the electrochemical impedance at different effective frequencies can be obtained in a short time in the present disclosure, thus improving the speed of constructing the electrochemical impedance spectrum.

In an embodiment of the present disclosure, in Step S40, the step of determining an electrochemical impedance of a corresponding frequency according to the second battery signal, and constructing an electrochemical impedance spectrum according to all the electrochemical impedance includes the following steps:

S401: Corresponding first amplitude information of the voltage signal in the second battery signal is acquired, corresponding second amplitude information of the current signal in the second battery signal is acquired, and a ratio of the first amplitude information to the second amplitude information is recorded as a resistance amplitude information corresponding to the effective frequency of the second battery signal.

In an example, the voltage signal and the current signal in the second battery signal are both expressed in the form of complex numbers, the modulus of the voltage signal in the form of complex number is determined as the first amplitude information corresponding to the voltage signal, and the modulus of the current signal in the form of complex number is determined as the second amplitude information corresponding to the current signal. The modulus is calculated as follows: Assuming that the expression of the voltage signal is $Z_U = a + i_1 b$ (where a is the real component of the voltage signal of the expression, b is the coefficient of the imaginary part of the voltage signal of the expression, and $i_1$ is the imaginary part of the voltage signal of the expression), the modulus corresponding to the voltage signal, that is, the first amplitude information, is: $|A| = \sqrt{a^2 + b^2}$. Similarly, assuming that the expression of the current signal is $Z_I = c + i_2 d$ (where c is the real part of the current signal of the expression, d is the coefficient of the imaginary part of the current signal of the expression, and $i_2$ is the imaginary part of the current signal of the expression), the modulus corresponding to the current signal, that is, the second amplitude information, is: $|B| = \sqrt{c^2 + d^2}$. Then, the resistance amplitude information is: $|A|/|B|$.

Specifically, after determining the second battery signal from the multiple first battery signals the corresponding first amplitude information of the voltage signal in the second battery signal is acquired, the corresponding second amplitude information of the current signal in the second battery signal is acquired, and the ratio of the first amplitude information to the second amplitude information is recorded as the resistance amplitude information corresponding to the effective frequency of the second battery signal.

S402: Corresponding first phase information of the voltage signal in the second battery signal is acquired, corresponding second phase information of the current signal in the second battery signal is acquired, and a difference between the first phase information and the second phase information is recorded as a resistance phase information corresponding to the effective frequency of the second battery signal.

The phase angle of the voltage signal in the form of complex number is determined as the first phase information corresponding to the voltage signal, and the phase of the current signal in the form of complex number is determined as the second phase information corresponding to the current signal. The phase angle is calculated as follows: Assuming that the expression of the voltage signal is $Z_U = a + i_1 b$ (where a is the real component of the voltage signal of the expression, b is the coefficient of the imaginary part of the voltage signal of the expression, and $i_1$ is the imaginary part of the voltage signal of the expression), the phase angle corresponding to the voltage signal, that is, the first phase information is $\omega_U = \tan^{-1}(b/a)$. Similarly, assuming that the expression of the current signal is $Z_I = c + i_2 d$ (where c is the real component of the current signal of the expression, d is the coefficient of the imaginary part of the current signal of the expression, and $i_2$ is the imaginary part of the voltage signal of the expression), the phase angle corresponding to the current signal, that is, the second phase information is: $\omega_I = \tan^{-1}(d/c)$. Then, the resistance phase information is: $\omega_U - \omega_I$.

Specifically, after determining the second battery signal from all the frequency-based first battery signals corresponding to all the battery discharge information, the corresponding first phase information of the voltage signal in the second battery signal is acquired, the corresponding second phase information of the current signal in the second battery signal is acquired, and the difference between the first phase information and the second phase information is recorded as a resistance phase information corresponding to the effective frequency of the second battery signal.

S403: The electrochemical impedance corresponding to the effective frequency of the second battery signal is determined according to the resistance amplitude information and the resistance phase information.

Specifically, after the ratio of the first amplitude information to the second amplitude information is recorded as the resistance amplitude information corresponding to the effective frequency of the second battery signal, and the difference between the first phase information and the second phase information is recorded as a resistance phase information corresponding to the effective frequency of the second battery signal, the electrochemical impedance corresponding to the effective frequency of the second battery signal is determined according to the resistance amplitude information and the resistance phase information.

Specifically, assuming that the resistance amplitude information is: R (|A|/|B| exemplified above) and the resistance phase information is: θ ($\omega_U - w_I$ exemplified above), then the electrochemical impedance corresponding to the effective frequency of the second battery signal is determined according to the resistance amplitude information and the resistance phase information. The electrochemical impedance includes a real part and an imaginary part, and expressed as follows:

The real part of the electrochemical impedance is expressed as: $R_{re} = R \cdot \cos \theta$; and the imaginary part of the electrochemical impedance is expressed as: $R_{im} = R \cdot \sin \theta$.

S404: The electrochemical impedance spectrum is constructed according to the effective frequency of the second battery signal and the corresponding electrochemical impedance.

Specifically, after determining the electrochemical impedance corresponding to the effective frequency of the second battery signal according to the resistance amplitude information and the resistance phase information, the electrochemical impedance spectrum is constructed according to the effective frequency of second battery signal and the corresponding electrochemical impedance. The effective frequency of the second battery signal is the frequency corresponding to the second battery signal.

In some embodiments, as shown in FIG. 2, the L2 curve is an example of the curve corresponding to the electrochemical impedance spectrum constructed in the present disclosure. In this curve, the abscissa corresponding to each point is the real part of the electrochemical impedance; the ordinate corresponding to each point is the imaginary part of the electrochemical impedance; and each point represents the effective frequency.

It should be noted that in Step S10, after the battery discharge information of the battery is collected periodically according to the preset collection interval, to construct the electrochemical impedance spectrum curve L2 as shown in FIG. 2. Steps S20-S40 can be performed with the battery discharge information corresponding to some collection time. Further, the start point corresponding to the L2 curve in FIG. 2 represents the frequency point corresponding to the collection interval, which can be determined according to the collection interval of the battery discharge information; and the end point corresponding to the L2 curve can be determined according to the total collection duration of the battery discharge information.

In an embodiment of the present disclosure, in Step S20, the step of performing fast Fourier transform according to the collection interval and the battery discharge information to obtain the frequency-based first battery signal corresponding to the battery discharge information includes:

S201: Fourier expansion is performed on the battery discharge information according to the collection interval, to obtain the time-based battery signal corresponding to the battery discharge information.

The Fourier expansion refers to the decomposition of the battery discharge information into sine superposition of multiple frequencies. The time-based battery signal represents the relation between the battery discharge information and time.

Specifically, the step of performing Fourier transform according to the collection interval and the battery discharge information after the battery discharge information of the battery is collected periodically according to the preset collection interval includes: performing Fourier expansion on the current information, to obtain the time-based current signal corresponding to the current information; and performing Fourier expansion on the voltage information, to obtain the time-based voltage signal corresponding to the voltage information.

Optionally, Fourier expansion can be performed on the current information in the battery discharge information according to an expression below:

$$I(t) = \frac{a_{I0}}{2} + \sum_{n=1}^{\infty} (a_{In} \cos 2\pi n f t + b_{In} \sin 2\pi n f t)$$

$$a_{In} = \frac{2}{T} \int_{t_0}^{t_0+T} I(t) \cos(2\pi n f t)$$

$$b_{In} = \frac{2}{T} \int_{t_0}^{t_0+T} I(t) \cos(2\pi n f t)$$

where I(t) is the current collected at the time point t (which may also be used as the time-based current signal); f is the frequency; $a_{I0}$ is the first term of the Fourier expansion formula, $a_{In}$ and $b_{In}$ are both the Fourier coefficients; n is the Fourier expansion series; T is the collection interval, and $t_0$ is the initial collection time.

Fourier expansion can be performed on the voltage information in the battery discharge information according to an expression below:

$$V(t) = \frac{a_{V0}}{2} + \sum_{n=1}^{\infty} (a_{Vn} \cos 2\pi n f t + b_{Vn} \sin 2\pi n f t)$$

$$a_{Vn} = \frac{2}{T} \int_{t_0}^{t_0+T} V(t) \cos(2\pi n f t)$$

$$b_{Vn} = \frac{2}{T} \int_{t_0}^{t_0+T} V(t) \cos(2\pi n f t)$$

where V(t) is the voltage collected at the time point t (which may also be used as the time-based voltage signal); f is the frequency; $a_{v0}$ is the first term of the Fourier expansion formula, $a_{v_n}$ and $b_{v_n}$ are both the Fourier coefficients; n is the Fourier expansion series; T is the collection interval, and $t_0$ is the initial collection time.

In some embodiments, after performing Fourier expansion on the current information in the battery discharge information according to the collection interval to obtain the time-based current signal corresponding to the current information, and performing Fourier expansion on the voltage information in the battery discharge information according to the collection interval to obtain the time-based voltage signal corresponding to the voltage information, the time-based current signal and the time-based voltage signal are correlated and recorded as the time-based battery signal.

S202: Fast Fourier transform is performed on the time-based battery signal, to obtain the frequency-based first battery signal corresponding to the battery discharge information.

Specifically, after performing Fourier expansion on the battery discharge information according to the collection interval to obtain the time-based battery signal corresponding to the battery discharge information, Fast Fourier transform is performed on the time-based battery signal. The fast Fourier transform includes specifically the steps of:

performing fast Fourier transform on the time-based battery signal, to obtain the frequency-based current signal corresponding to the current information;

Optionally, fast Fourier transform can be performed on the time-based current signal by an expression below:

$$I(f) = \int\limits_{-\infty}^{+\infty} I(t)e^{-i2\pi ft}dt$$

where I(f) is the frequency-based current signal; t is the collection time of the current information corresponding to the frequency-based current signal; f is the frequency; and I(t) is the time-based current signal, i is the complex unit.

Fast Fourier transform is performed on the time-based voltage signal, to obtain the frequency-based voltage signal corresponding to the voltage information.

In some embodiment, fast Fourier transform can be performed on the time-based voltage signal by an expression below:

$$V(f) = \int\limits_{-\infty}^{+\infty} V(t)e^{-i2\pi ft}dt$$

where V(f) is the frequency-based voltage signal; t is the collection time of the voltage information corresponding to the frequency-based voltage signal; f is the frequency; and V(t) is the time-based voltage signal, i is the complex unit.

In some embodiments, after performing fast Fourier transform on the current signal in the time-based battery signal to obtain the frequency-based current signal corresponding to the time-based current signal, and performing fast Fourier transform on the voltage signal in the time-based battery signal to obtain the frequency-based voltage signal corresponding to the time-based voltage signal, the frequency-based current signal and the frequency-based voltage signal are recorded as the frequency-based first battery signal.

It should be understood that the serial number of various steps does not indicate the order of implementation, and the order of implementation of each process should be determined by its function and internal logic and should not constitute any limitation on the implementation process of the embodiment in the present disclosure.

In an embodiment of the present disclosure, a system for generating an electrochemical impedance spectrum for a battery is provided. The system for generating an electrochemical impedance spectrum for a battery corresponds to the method for generating an electrochemical impedance spectrum for a battery according to the foregoing embodiments. As shown in FIG. 3, a system 100 for generating an electrochemical impedance spectrum for a battery includes specifically:

an information collection module 110, configured to collect, in a discharge state of the battery, battery discharge information of the battery periodically according to a preset collection interval, where the battery discharge information includes collection time, and current information and voltage information associated with the collection time;

a Fourier transform module 120, configured to perform Fourier transform according to the collection interval and the battery discharge information, to obtain multiple frequency-based first battery signals;

a signal selection module 130, configured to determine a second battery signal from the multiple first battery signals, where the second battery signal includes a voltage signal greater than or equal to a preset voltage threshold; and an electrochemical impedance spectrum construction module 140, configured to determine an electrochemical impedance of a corresponding frequency according to the second battery signal, and construct an electrochemical impedance spectrum according to all the electrochemical impedance.

For example, the electrochemical impedance spectrum construction module 140 includes:

an amplitude information acquisition unit, configured to acquire corresponding first amplitude information of the voltage signal in the second battery signal and corresponding second amplitude information of the current signal in the second battery signal, and record a ratio of the first amplitude information to the second amplitude information as a resistance amplitude information corresponding to the effective frequency of the second battery signal;

a phase information acquisition unit, configured to acquire corresponding first phase information of the voltage signal in the second battery signal and corresponding second phase information of the current signal in the second battery signal, and record a difference between the first phase information and the second phase information as a resistance phase information corresponding to the effective frequency of the second battery signal;

an electrochemical impedance determination unit, configured to determine, according to the resistance amplitude information and the resistance phase information, the electrochemical impedance corresponding to the effective frequency of the second battery signal; and an electrochemical impedance spectrum construction unit, configured to construct the electrochemical impedance spectrum according to the effective frequency of the second battery signal and the corresponding electrochemical impedance.

For example, the Fourier transform module 120 includes:

a time-based signal determination unit, configured to perform, according to the collection interval, Fourier expansion on the battery discharge information, to obtain the time-based battery signal corresponding to the battery discharge information; and a frequency-based signal determination unit, configured to perform fast Fourier transform on the time-based battery signal, to obtain the frequency-based first battery signal corresponding to the battery discharge information.

For example, the time-based signal determination unit includes:

a time-based current signal determination sub-unit, configured to perform, according to the collection interval, Fourier expansion on the current information, to obtain a time-based current signal corresponding to the current information;

a time-based voltage signal determination sub-unit, configured to perform, according to the collection interval, Fourier expansion on the voltage information, to obtain a time-based voltage signal corresponding to the voltage information; and a time-based signal determination sub-unit, configured to correlate and record the time-based current signal and the time-based voltage signal as the time-based battery signal.

For example, the frequency-based signal determination unit includes:

a frequency-based current signal determination sub-unit, configured to perform Fourier transform on the time-based current signal, to obtain a frequency-based current signal corresponding to the current information;

a frequency-based voltage signal determination sub-unit, configured to perform fast Fourier transform on the time-based voltage signal, to obtain a frequency-based voltage signal corresponding to the voltage information; and a frequency-based signal determination sub-unit, configured to record the frequency-based current signal and the frequency-based voltage signal as the frequency-based first battery signal.

Figure 4:
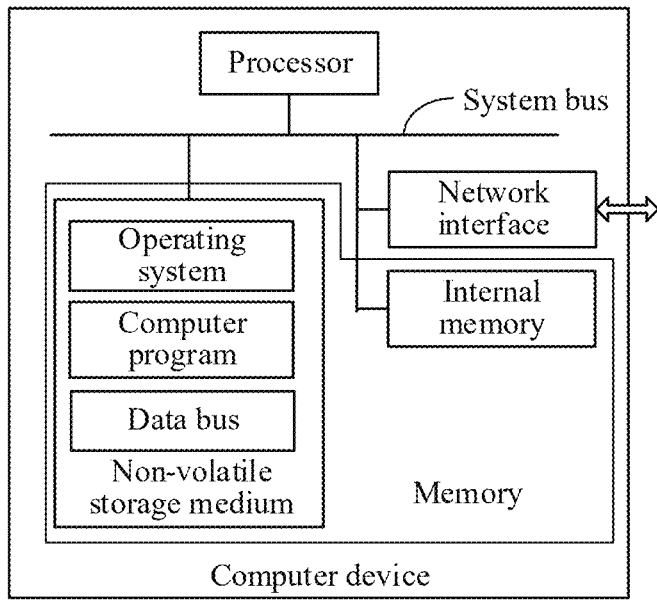
FIG. 4 is a schematic diagram of a computer device according to an embodiment of the present disclosure.

In an embodiment of the present disclosure, a computer device is provided, which can be a server and has an internal structure as shown in FIG. 4. The computer device includes a processor, a memory, and a network interface connected through a system bus. The processor of the computer device is used to provide the calculation and control abilities. The memory of the computer device includes a non-volatile storage medium and an internal memory. An operating system, a computer program, and a database are stored in the non-volatile storage medium. The internal memory provides an environment for the operation of the operating system and computer program in the non-volatile storage medium. The network interface of the computer device is used to communicate with an external terminal through network connection. The computer program, when executed by a processor, implements the method for generating an electrochemical impedance spectrum for a battery.

Figure 5:
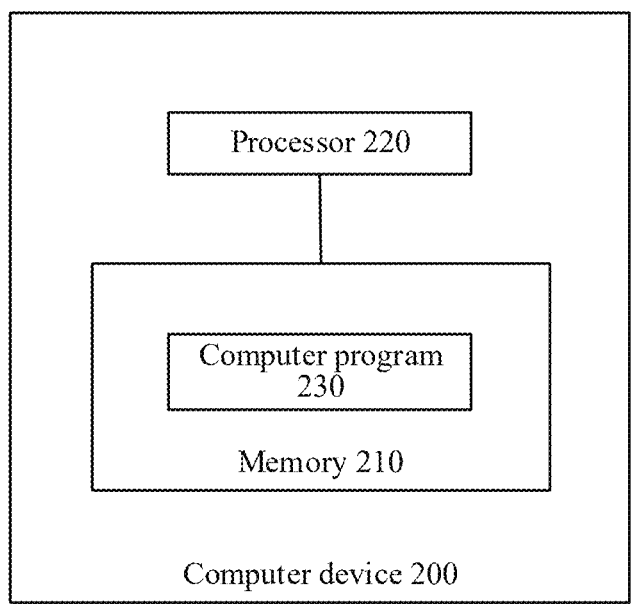
FIG. 5 is a schematic diagram of a computer device according to another embodiment of the present disclosure.

In an embodiment of the present disclosure, a computer device is provided. As shown in FIG. 5, a computer device 200 includes a memory 210, a processor 220, and a computer program 230 stored on the memory 210 and executed by the processor 220. The computer program 230, when executed by the processor 220, implements the method for generating an electrochemical impedance spectrum for a battery according to the foregoing embodiments.

In an embodiment of the present disclosure, a computer-readable storage medium is provided, on which a computer program is stored. The computer program, when executed by a processor, implements the method for generating an electrochemical impedance spectrum for a battery according to the foregoing embodiments.

Those of ordinary skill in the art can understand that all or part of the processes implementing the above-described methods in some embodiments can be implemented by a computer program instructing related hardware. The computer program may be stored in a non-volatile computer readable storage medium; and when the computer program is executed, the processes of the methods in above-mentioned embodiments are implemented. Any reference to the memory, storage, database or other media used in some embodiments provided in the present disclosure includes non-volatile and/or volatile memory. Non-volatile memory may include read only memory (ROM), programmable ROM (PROM), electrically programmable ROM (EPROM), electrically erasable programmable ROM (EEPROM), or flash memory. Volatile memory may include random access memory (RAM) or external cache memory. For the purpose of illustration but not limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

It can be clearly understood by those skilled in the art that for the convenience and ease of description, the description is given with the division of functional units and modules as an example. In practical use, the above functions can be allocated to and implemented by different functional units and modules as required. That is, the internal structure of the device is divided into different functional units or modules, so as to implement all or part of the functions described above.

The above embodiments are merely used for illustrating rather than limiting the technical solutions of the present disclosure. Although the present disclosure has been described in detail with reference to the foregoing embodiments, those of ordinary skill in the art should understand that the technical solutions described in the above various embodiments can be modified, or some of the technical features therein can be equivalently substituted. Such modifications and substitutions do not cause the essence of the corresponding technical solution to depart from the spirit and scope of the embodiments of the present disclosure and are contemplated in the scope of protection of the present disclosure.

What is claimed is:

1. A method for generating an electrochemical impedance spectrum for a battery of a vehicle, comprising:

when the battery is discharged to power other devices of the vehicle, collecting battery discharge information of the battery periodically and on board according to a preset collection interval, wherein the battery discharge information comprises collection time, and current information and voltage information, and wherein the collection time is every time point when the battery discharge information is collected, the current information is a corresponding current value of the battery at each collection time, and the voltage information is a corresponding voltage value of the battery at each collection time;

performing Fourier transform according to the collection interval and the battery discharge information, to obtain multiple frequency-based first battery signals;

determining a preset voltage threshold;

determining a second battery signal from the multiple first battery signals, wherein the second battery signal comprises a voltage signal greater than or equal to the preset voltage threshold;

determining an electrochemical impedance of a corresponding frequency according to the second battery signal, and constructing an electrochemical impedance spectrum according to all the electrochemical impedance without an off-line electrochemical workstation, and presenting the electrochemical impedance spectrum as an electrochemical impedance spectrum curve to reflect an overall state of the battery of the vehicle, wherein a start point of the electrochemical impedance spectrum curve is limited by a frequency of the collection time, wherein determining the preset voltage threshold comprises:

setting an initial voltage threshold;

increasing the initial voltage threshold by a preset increment, until the obtained electrochemical impedance spectrum curve is a smooth curve; and using the voltage threshold corresponding to the smooth curve as the reset voltage threshold.

2. The method according to claim 1, wherein the determining an electrochemical impedance of a corresponding frequency according to the second battery signal, and constructing an electrochemical impedance spectrum according to all the electrochemical impedance comprises:

acquiring a corresponding first amplitude information of a voltage signal in the second battery signal and a corresponding second amplitude information of a current signal in the second battery signal, and recording a ratio of the first amplitude information to the second amplitude information as a resistance amplitude information corresponding to an effective frequency of the second battery signal, wherein the effective frequency of the second battery signal is the frequency corresponding to the second battery signal;

acquiring a corresponding first phase information of the voltage signal in the second battery signal and a corresponding second phase information of the current signal in the second battery signal, and recording a difference between the first phase information and the second phase information as a resistance phase information corresponding to the effective frequency of the second battery signal;

determining the electrochemical impedance corresponding to the effective frequency of the second battery signal according to the resistance amplitude information and the resistance phase information; and constructing the electrochemical impedance spectrum according to the effective frequency of the second battery signal and the corresponding electrochemical impedance.

3. The method according to claim 2, wherein the acquiring a corresponding first phase information of the voltage signal in the second battery signal and a corresponding second phase information of the current signal in the second battery signal comprises:

expressing both the voltage signal and the current signal in the second battery signal in the form of complex numbers;

determining the modulus of the voltage signal in the form of complex number as the first amplitude information corresponding to the voltage signal; and determining the modulus of the current signal in the form of complex number as the second amplitude information corresponding to the current signal.

4. The method according to claim 3, wherein the acquiring a corresponding first phase information of the voltage signal in the second battery signal and a corresponding second phase information of the current signal in the second battery signal comprises:

determining the phase angle of the voltage signal in the form of complex number as the first phase information corresponding to the voltage signal; and determining the phase of the current signal in the form of complex number as the second phase information corresponding to the current signal.

5. The method according to claim 2, wherein the electrochemical impedance comprises a real part and an imaginary part, the real part of the electrochemical impedance is $R_{re}=R\cdot\cos\theta$, and the imaginary part of the electrochemical impedance is $R_{im}=R\cdot\sin\theta$, where R is the resistance amplitude information, and $\theta$ is the resistance phase information.

6. The method according to claim 1, wherein the step of performing Fourier transform according to the collection interval and the battery discharge information to obtain multiple frequency-based first battery signals comprises:

performing Fourier expansion on the battery discharge information according to the collection interval, to obtain a time-based battery signal corresponding to the battery discharge information; and performing fast Fourier transform on the time-based battery signal, to obtain the frequency-based first battery signal corresponding to the battery discharge information.

7. The method according to claim 6, wherein the performing Fourier expansion on the battery discharge information according to the collection interval to obtain a time-based battery signal corresponding to the battery discharge information comprises:

performing Fourier expansion on the current information according to the collection interval, to obtain a time-based current signal corresponding to the current information;

performing Fourier expansion on the voltage information according to the collection interval, to obtain a time-based voltage signal corresponding to the voltage information; and correlating and recording the time-based current signal and the time-based voltage signal as the time-based battery signal.

8. The method according to claim 7, wherein Fourier expansion is performed on the current information according to an expression below $$I(t) = \frac{a_{I0}}{2} + \sum_{n=1}^{\infty} (a_{In}\cos 2\pi nft + b_{In}\sin 2\pi nft)$$

$$a_{In} = \frac{2}{T} \int_{t_0}^{t_0+T} I(t)\cos(2\pi nft)$$

$$b_{In} = \frac{2}{T} \int_{t_0}^{t_0+T} I(t)\cos(2\pi nft)$$

15 where I(t) is the time-based current signal, f is the frequency; and $a_{f0}$ is the first term of the Fourier expansion formula, $a_{fn}$ and $b_{fn}$ are both the Fourier coefficients, n is the Fourier expansion series, T is the collection interval, and $t_0$ is the initial collection time.

9. The method according to claim 7, wherein Fourier expansion is performed on the voltage information according to an expression below $$V(t) = \frac{a_{V0}}{2} + \sum_{n=1}^{\infty}(a_{Vn}\cos 2\pi n f t + b_{Vn}\sin 2\pi n f t)$$

$$a_{Vn} = \frac{2}{T}\int_{t_0}^{t_0+T} V(t)\cos(2\pi n ft)$$

$$b_{Vn} = \frac{2}{T}\int_{t_0}^{t_0+T} V(t)\cos(2\pi n ft)$$

where V(t) is the time-based voltage signal, f is the frequency, $a_{V0}$ is the first term of the Fourier expansion formula, $a_{Vn}$ and $b_{Vn}$ are both the Fourier coefficients, n is the Fourier expansion series, T is the collection interval, and $t_0$ is the initial collection time.

10. The method according to claim 6, wherein the performing fast Fourier transform on the time-based battery signal to obtain the frequency-based first battery signal corresponding to the battery discharge information comprises:

performing fast Fourier transform on the time-based current, signal, to obtain a frequency-based current signal corresponding to the current information;

performing fast Fourier transform on the time-based voltage signal, to obtain a frequency-based voltage signal corresponding to the voltage information; and recording the frequency-based current signal and the frequency-based voltage signal as the frequency-based first battery signal.

11. The method according to claim 10, wherein fast Fourier transform is performed on the time-based current signal by an expression below:

$$I(f) = \sum_{-\infty}^{+\infty}I(t)e^{-i2\pi ft}d\tau$$

where I(f) is the frequency-based current signal, t is the collection time of the current information corresponding to the frequency-based current signal, f is the frequency, and I(t) is the time-based current signal, i is a complex unit.

12. The method for generating an electrochemical impedance spectrum tor a battery according to claim 10, wherein fast Fourier transform is performed on the time-based voltage signal by an expression below:

$$V(f) = \int_{-\infty}^{+\infty}V(t)e^{-i2\pi ft}dt$$

where V(f) is the frequency-based voltage signal, t is the collection time of the voltage information corresponding to the frequency-based voltage signal; f is the frequency, and V(t) is the time-based voltage signal, i is a complex unit.

13. The method according to claim 1, wherein the preset voltage threshold is in the range of 0.1 to 0.5 V.

14. A non-transitory computer readable storage medium storing computer-executable instructions for, when executed by one or more processors, performing a method for generating an electrochemical impedance spectrum for a battery of a vehicle, the method comprising:

when the batter is discharged to power other devices of the vehicle, collecting battery discharge information of the battery periodically and on board according to a preset collection interval, wherein the battery discharge information comprises collection time, and current information and voltage information, and wherein the collection time is every time point when the battery discharge information is collected, the current information is a corresponding current value of the battery at each collection time, and the voltage information is a corresponding voltage value of the battery at each collection time;

performing Fourier transform according to the collection interval and the battery discharge information, to obtain multiple frequency-based first battery signals;

determining a preset voltage threshold;

determining a second battery signal from the multiple first battery signals, wherein the second battery signal comprises a voltage signal greater than or equal to the preset voltage threshold;

determining an electrochemical impedance of a corresponding frequency according to the second battery signal, and constructing an electrochemical impedance spectrum according to all the electrochemical impedance without an off-line electrochemical workstation, and presenting the electrochemical impedance spectrum as an electrochemical impedance spectrum curve to reflect an overall state of the battery of the vehicle, wherein a start point of the electrochemical impedance spectrum curve is limited by a frequency of the collection time, wherein determining the preset voltage threshold comprises:

setting an initial voltage threshold;

increasing the initial voltage threshold by a preset increment, until the obtained electrochemical impedance spectrum curve is a smooth curve; and using the voltage threshold corresponding to the smooth curve as the preset voltage threshold.

15. The non-transitory computer readable storage medium according to claim 14, wherein the determining an electrochemical impedance of a corresponding frequency according to the second battery signal, and constructing an electrochemical impedance spectrum according to all the electrochemical impedance comprises:

acquiring a corresponding first amplitude information of a voltage signal in the second battery signal and a corresponding second amplitude information of a current signal in the second battery signal, and recording a ratio of the first amplitude information to the second amplitude information as a resistance amplitude information corresponding to an effective frequency of the second battery signal, wherein the effective frequency of the second battery signal is the frequency corresponding to the second battery signal;

acquiring a corresponding first phase information of the voltage signal in the second battery signal and a corresponding second phase information of the current signal in the second battery signal, and recording a difference between the first phase information and the second phase information as a resistance phase information corresponding to the effective frequency of the second battery signal;

determining the electrochemical impedance corresponding to the effective frequency of the second battery signal according to the resistance amplitude information and the resistance phase information; and constructing the electrochemical impedance spectrum according to the effective frequency of the second battery signal and the corresponding electrochemical impedance.

16. The non-transitory computer readable storage medium according to claim 15, wherein the acquiring a corresponding first phase information of the voltage signal in the second battery signal and a corresponding second phase information of the current signal in the second battery signal comprises:

expressing both the voltage signal and the current signal in the second battery signal in the form of complex numbers;

determining the modulus of the voltage signal in the form of complex number as the first amplitude information corresponding to the voltage signal; and determining the modulus of the current signal in the form of complex number as the second amplitude information corresponding to the current signal.

17. A computer device for generating an electrochemical impedance spectrum for a battery of a vehicle, comprising:

a memory storing computer-executable computer programs; and at least one processor configured to execute the computer program to perform:

when the battery is discharged to power other devices of the vehicle, collecting battery discharge information of the battery periodically and on board according to a preset collection interval, wherein the battery discharge information comprises collection time, and current information and voltage information, and wherein the collection time is every time point when the battery discharge information is collected, the current information is a corresponding current value of the battery at each collection time, and the voltage information is a corresponding voltage value of the battery at each collection time;

performing Fourier transform according to the collection interval and the battery discharge information, to obtain multiple frequency-based first battery signals;

determining a preset voltage threshold;

determining a second battery signal from the multiple first battery signals, wherein the second battery signal comprises a voltage signal greater than or equal to the preset voltage threshold;

determining an electrochemical impedance of a corresponding frequency according to the second battery signal, and constructing an electrochemical impedance spectrum according to all the electrochemical impedance without an off-line electrochemical workstation, and presenting the electrochemical impedance spectrum as an electrochemical impedance spectrum curve to reflect an overall state of the batter of the vehicle, wherein a start point of the electrochemical impedance spectrum curve is limited by a frequency of the collection time, wherein determining the preset voltage threshold comprises:

setting an initial voltage threshold;

increasing the initial voltage threshold by a preset increment, until the obtained electrochemical impedance spectrum curve is a smooth curve; and using the voltage threshold corresponding to the smooth curve as the preset voltage threshold.

18. The computer device according to claim 17, wherein the determining an electrochemical impedance of a corresponding frequency according to the second battery signal, and constructing an electrochemical impedance spectrum according to all the electrochemical impedance comprises:

acquiring a corresponding first amplitude information of a voltage signal in the second battery signal and a corresponding second amplitude information of a current signal in the second battery signal, and recording a ratio of the first amplitude information to the second amplitude information as a resistance amplitude information corresponding to an effective frequency of the second battery signal, wherein the effective frequency of the second battery signal is the frequency corresponding to the second battery signal;

acquiring a corresponding first phase information of the voltage signal in the second battery signal and a corresponding second phase information of the current signal in the second battery signal, and recording a difference between the first phase information and the second phase information as a resistance phase information corresponding to the effective frequency of the second battery signal;

determining the electrochemical impedance corresponding to the effective frequency of the second battery signal according to the resistance amplitude information and the resistance phase information; and constructing the electrochemical impedance spectrum according to the effective frequency of the second battery signal and the corresponding electrochemical impedance.

19. The computer device according to claim 18, wherein the acquiring a corresponding first phase information of the voltage signal in the second battery signal and a corresponding second phase information of the current signal in the second battery signal comprises:

expressing both the voltage signal and the current signal in the second battery signal in the form of complex numbers;

determining the modulus of the voltage signal in the form of complex number as the first amplitude information corresponding to the voltage signal; and determining the modulus of the current signal in the form of complex number as the second amplitude information corresponding to the current signal.

* * * * *